United States Patent
Hatae et al.

(10) Patent No.: US 6,762,491 B1
(45) Date of Patent: Jul. 13, 2004

(54) POWER SEMICONDUCTOR DEVICE

(75) Inventors: Shinji Hatae, Tokyo (JP); Korehide Okamoto, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/445,931

(22) Filed: May 28, 2003

(30) Foreign Application Priority Data

Jan. 23, 2003 (JP) ........................................ 2003-014633

(51) Int. Cl.[7] .............................................. H01L 23/34
(52) U.S. Cl. ........................ 257/712; 257/687; 257/691; 257/731; 257/733; 257/736; 257/772; 257/779
(58) Field of Search ................. 257/712, 687, 257/691, 731, 733, 736, 772, 779

(56) References Cited

U.S. PATENT DOCUMENTS

| | | | | |
|---|---|---|---|---|
| 3,839,660 A | * | 10/1974 | Stryker | 257/700 |
| 4,352,120 A | * | 9/1982 | Kurihara et al. | 257/704 |
| 4,358,785 A | * | 11/1982 | Takigami et al. | 257/747 |
| 4,482,913 A | * | 11/1984 | Burke et al. | 257/746 |
| 4,561,010 A | * | 12/1985 | Ogihara et al. | 257/705 |
| 5,291,065 A | * | 3/1994 | Arai et al. | 257/723 |
| 5,446,318 A | * | 8/1995 | Koike et al. | 257/707 |
| 5,488,256 A | * | 1/1996 | Tsunoda | 257/723 |
| 5,521,437 A | * | 5/1996 | Oshima et al. | 257/701 |
| 5,808,358 A | * | 9/1998 | Vinciarelli et al. | 257/700 |
| 6,133,071 A | * | 10/2000 | Nagai | 438/122 |
| 6,297,549 B1 | * | 10/2001 | Hiyoshi | 257/703 |
| 6,369,411 B2 | * | 4/2002 | Matsumoto | 257/182 |
| 6,421,244 B1 | * | 7/2002 | Shinohara et al. | 361/736 |
| 2002/0030268 A1 | * | 3/2002 | Sakamoto et al. | 257/700 |
| 2002/0050633 A1 | * | 5/2002 | Matsumoto | 257/685 |
| 2003/0122232 A1 | * | 7/2003 | Hirano et al. | 257/678 |
| 2003/0151128 A1 | * | 8/2003 | Kawaguchi | 257/691 |

FOREIGN PATENT DOCUMENTS

| | | |
|---|---|---|
| JP | 57-80747 | 5/1982 |
| JP | 10-50928 | 2/1998 |
| JP | 10-189845 | 7/1998 |

* cited by examiner

*Primary Examiner*—Jasmine Clark
(74) *Attorney, Agent, or Firm*—Oblon, Spivak, McClelland, Maier & Neustadt, P.C.

(57) ABSTRACT

The present invention is to provide a power semiconductor device including a heat radiator having a principal surface and an insulating substrate bonded on the principal surface of the heat radiator via a first solder layer. The power semiconductor device also includes at least one semiconductor chip mounted on the insulating substrate via a second solder layer. The insulating substrate has a thin-layer and thick-layer edges, and is bonded on the principal surface of the heat radiator so that the first solder layer has a thickness thinner towards a direction from the thin-layer edge to the thick-layer edge ($T_1 > T_2$). Also, the semiconductor chip is mounted on the insulating substrate so that a first distance between the thick-layer edge and the semiconductor chip is less than a second distance between the thin-layer edge and the semiconductor chip ($L_1 < L_2$).

12 Claims, 4 Drawing Sheets

POWER SEMICONDUCTOR DEVICE

BACKGROUND OF THE INVENTION

1) Technical field of the Invention

The present invention relates to a power semiconductor device, and in particular, relates to the power semiconductor device with improved reliability for a thermal shock test.

2) Description of Related Arts

A power semiconductor device such as a power module includes, in general, an insulating substrate and a heat radiator (heat sink) bonded thereon via an adhesive layer of electrically conductive material such as a solder layer. Mounted on the substrate are a plurality of semiconductor chips such as an insulating gate bipolar transistor (IGBT) and a free wheel diode (FWD).

The power semiconductor device is often exposed to the thermal shock due to a varying ambient temperature and heat generated from the semiconductor chips in operation. Difference of linear expansion coefficients (linear expansivity) between the insulating substrate and the heat radiator causes a substantial amount of strain (stress) within the intervening solder layer, in which the solder cracking is occurred. When heated, the heat radiator made of metal such as copper expands relative to the insulating substrate from the middle portion towards the circumference thereof, and when cooled, the heat radiator shrinks relative to the insulating substrate from the circumference towards the middle portion thereof. Therefore, the stress of the solder layer adjacent to the circumference is much greater than that adjacent to the middle portion. Thus, the solder cracking is firstly appeared on the circumference and extends towards the middle portion of the solder layer as the power semiconductor device is repeatedly exposed to a number of the thermal shocks.

The solder cracking of the solder layer may arise various problems, in particular, when the solder cracking extends through the area beneath the semiconductor chips generating a substantial amount of heat, it likely blocks the heat conducting from the semiconductor chips to the heat radiator. Thus, the solder cracking may cause the semiconductor chips to be overheated, and hence to malfunction. In order to improve the reliability for the thermal shocks, it is required to prevent and/or delay the extension of the solder cracking from the circumference towards the middle portion of the solder layer so that no solder cracking is generated especially beneath the semiconductor chips.

Many approaches to prevent and/or delay the extension of the solder cracking has been incorporated in the conventional power semiconductor device. For example, the first approach is to design the intervening solder layer with increased thickness to absorb the stress therein. The second one is to design the insulating substrate having a round corner with the increased radius of curvature so that the distance from the corner to the middle portion is reduced.

The third one is to arrange a plurality of different semiconductor chips on the insulating substrate in a symmetric manner so that the deviation in the thermal distribution of the insulating substrate heated by each semiconductor chip is minimized. The fourth one is to develop a new material of the insulating substrate for reducing the stress in the intervening solder layer.

Also, according to the fifth approach, the semiconductor chips are provided on the insulating substrate as far away as possible from the circumference, thereby to prevent the extension of the solder cracking through the area beneath the semiconductor chips.

On the other hand, according to the semiconductor device disclosed in JPA 10-50928, a plurality of bosses are provided between the insulating substrate and the heat radiator in order to control the intervening solder layer to be thicker than a predetermined thickness.

Also, according to the heat sink of the semiconductor device disclosed in JPA 10-189845, a peripheral trench is provided on the heat sink at the position corresponding to the circumference of the insulating substrate, which is filled up with the solder. This effectively increases the thickness of the solder layer so that the strain in the circumference of the solder layer is absorbed.

However, there are several drawbacks with the above-mentioned approaches. That is, the intervening solder layer with the increased thickness causes a poor thermal conductivity of heat from the insulating substrate to the heat radiator via the intervening solder layer. Also, the package or size of the semiconductor device is increased because of the insulating substrate having the round corner (the second approach). Also, much greater space or area for mounting the semiconductor chips is required if the semiconductor chips are arranged on the insulating substrate in a symmetric manner (the third approach), or at positions as far away as possible from the circumference thereof (the fifth approach). Further, even though the new material of the insulating substrate has been developed (the fourth approach), it still needs time and efforts to adapt the material to the actual products.

Furthermore, the bosses indicated in JPA 10-50928 may be used to control the intervening solder layer to be thicker than a predetermined thickness. However, it can hardly controlled such that the thickness of the solder layer is uniform across the solder layer in a precise manner. When the insulating substrate is inclined relative to the heat sink in a certain direction, any one of the corners of the intervening solder layer has the thinner portion, so that the solder cracking extends from the thinner portion to the area beneath the semiconductor chips.

In addition, the trench disclosed in JPA 10-189845 may increase the thickness of the solder layer at the circumference, yet, the semiconductor device has to be mounted on the heat sink in a flat or parallel manner.

SUMMARY OF THE INVENTION

To address the aforementioned problems, one of the aspects of the present invention is to provide a power semiconductor device including a heat radiator having a principal surface and an insulating substrate bonded on the principal surface of the heat radiator via a first solder layer. The power semiconductor device also includes at least one semiconductor chip mounted on the insulating substrate via a second solder layer. The insulating substrate has a thin-layer and thick-layer edges, and is bonded on the principal surface of the heat radiator so that the first solder layer has a thickness thinner towards a direction from the thin-layer edge to the thick-layer edge ($T_1 > T_2$). Also, the semiconductor chip is mounted on the insulating substrate so that a first distance between the thick-layer edge and the semiconductor chip is less than a second distance between the thin-layer edge and the semiconductor chip ($L_1 < L_2$).

Further scope of applicability of the present invention will become apparent from the detailed description given herein. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention more fully be understood from the detailed description given herein and accompanying drawings which are given by way of illustration only, and thus are not limitative of the present invention and wherein.

DETAILED DESCRIPTION OF THE PREFERRED EMBODIMENTS

Referring to the attached drawings, the details of embodiments according to the present invention will be described herein. In those descriptions, although the terminology indicating the directions (for example, "right side" and "left side") are conveniently used just for clarity, it should not be interpreted that those terminology limit the scope of the present invention.

Embodiment 1

Figure 1:
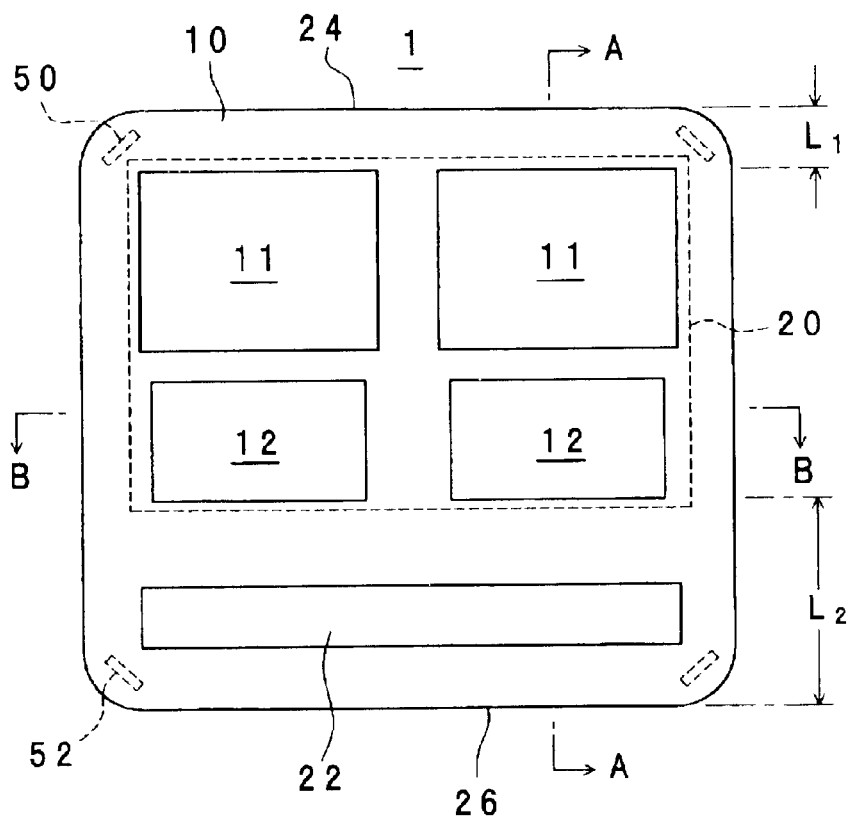
FIG. 1 is a top plan view of the power semiconductor device of Embodiment 1 according to the present invention.
Figure 2:
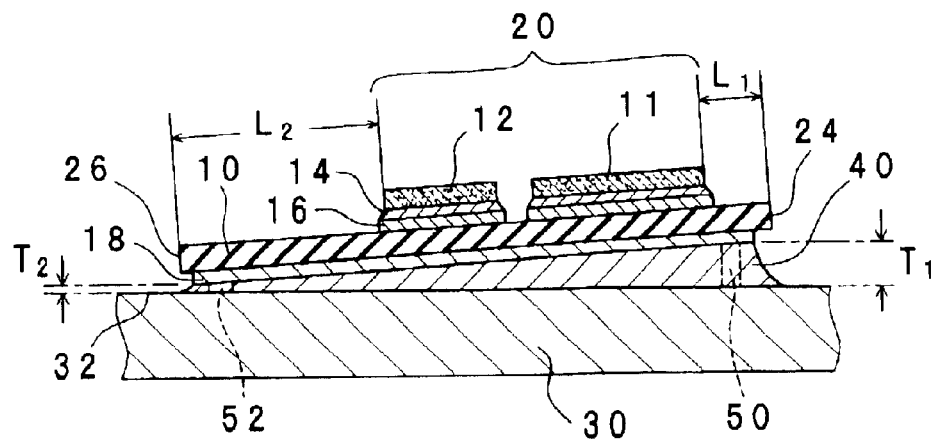
FIG. 2 is a cross sectional view of the power semiconductor device of Embodiment 1 taken along the A—A line of FIG. 1.

Referring to FIGS. 1 to 4, a power semiconductor device according to Embodiment 1 of the present invention will be described herein. In FIG. 1, the power semiconductor device 1 of Embodiment 1 includes an insulating substrate 10, on which a plurality of insulating gate bipolar transistors (IGBTs) 11 and free wheel diodes (FWDs) 12 are mounted via a solder layer 14 (FIG. 2). The area 20 indicated by an imaginary line of FIG. 1, on which those semiconductor chips are mounted, is referred herein to as a "die-bonding area". Also, an another area 22, on which a plurality of aluminum wires are bonded, is referred herein to as "wire-bonding area".

Figure 3:
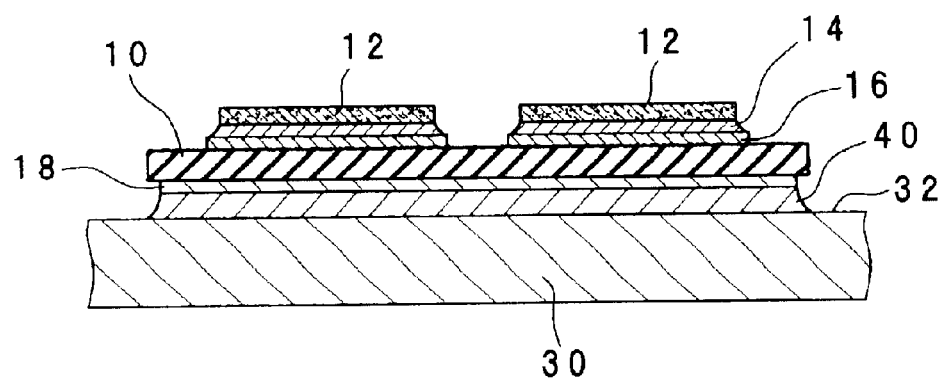
FIG. 3 is an another cross sectional view of the power semiconductor device of Embodiment 1 taken along the B—B line of FIG. 1.

FIGS. 2 and 3 illustrate cross sectional views taken along the lines of A—A and B—B of FIG. 1, respectively. The insulating substrate 10 includes a front and rear wired patterns 16, 18 formed on a front and rear surfaces, respectively. Although not limited to those, the insulating substrate 10 includes a plate of aluminum nitride (AlN) with thickness of about 0.64 mm, and the wired front and rear patterns 16, 18 includes a pair of films of copper (Cu) with thickness of about 0.30 mm and 0.15 mm, respectively.

The power semiconductor device 1 is bonded or adhered on a heat radiator 30 such as a heat sink via a first solder layer 40. As above, a plurality of IGBTs 11 and FWDs 12 are mounted on the front wired pattern 16 via the second solder layer 14. Also, a plurality of aluminum wires (not shown) are used for electrical connections between the FWDs 12 and the wire-bonding area 22, and between the respective IGBT 11 and the corresponding FWD 12.

According to the power semiconductor device 1 of Embodiment 1, the insulating substrate 10 having a substantially rectangular shape is bonded over the heat sink 30, inclining relative to a principal surface 32 of the heat sink 30, in a direction indicated by A—A line (shorter side) as shown in FIG. 2. Preferably, the insulating substrate 10 is bonded in parallel to the heat sink 30 in another direction indicated by B—B line (longer side) as illustrated in FIG. 3. Thus, the first solder layer 40 has thickness thinner towards the direction from the right side to the left side of FIG. 2. In the context of the present specification, the insulating substrate 10 includes a thick-layer and thin-layer edges 24, 26, which are defined herein as edges adjacent to areas of the solder layer 40 where it has the maximum and minimum thickness $T_1$ and $T_2$, respectively. Therefore, the insulating substrate 10 of the present invention is inclined relative to the principal surface 32 of the heat sink 30 so that the first solder layer 40 is thinner towards a direction from the thick-layer edge 24 to the thin-layer edge 26 ($T_1 > T_2$).

On the other hand, according to the present invention, the die-bonding area 20 of the insulating substrate 10 is positioned closer to the thick-layer edge 24 rather than the thin-layer edge 26. Thus, the die-bonding area 20 of the present invention is set such that the first distance ($L_1$) between the thick-layer edge 24 and the IGBT 11 is shorter than the second distance ($L_2$) between the thin-layer edge 26 and the FWD 12 ($L_1 < L_2$). Contrary, the wire-bonding area 22 is positioned closer to the thin-layer edge 26 rather than the thick-layer edge 24, thus, the first solder layer 40 is relatively thin beneath the wire-bonding area 22.

Figure 4:
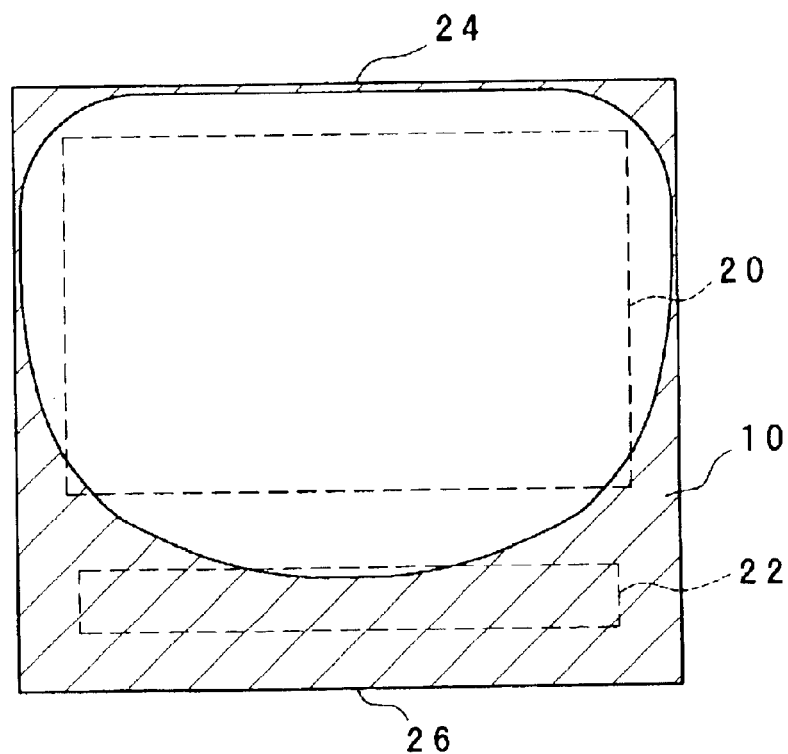
FIG. 4 is a phantom view illustrating the area of the solder cracking extension with the hatching.

According to the power semiconductor device 1 so constructed, the first solder layer 40 beneath the die-bonding area 20 can be thick enough to absorb the stress therein so that the extension of the solder cracking from the circumference to the middle portion of the solder layer 40 can be precluded or delayed. FIG. 4 illustrates the area of the solder layer 40 with the hatching where the solder cracking extends after the power semiconductor device 1 has been exposed to a predetermined number of thermal shocks. As shown, while the solder cracking extends from the circumference adjacent to the thin-layer edge 26 through the solder layer 40 beneath the wire-bonding area 22, but not through the solder layer 40 beneath the die-bonding area 20. Therefore, the semiconductor chips 11, 12 can be thermally radiated via the solder layer 40 in an efficient manner. Thus, the power semiconductor device having the improved reliability for the thermal shocks can be realized according to the present invention.

Further, since the extension of the solder cracking beneath the die-bonding area 20 can be prevented, the semiconductor chips 11, 12 of Embodiment 1 are arranged much closer to the thick-layer edge of the insulating substrate 10 than those of the conventional power semiconductor device. In other words, according to Embodiment 1, the first distance ($L_1$) between the thick-layer edge 24 and the IGBT 11 can be shorter than that of the prior art, thus, the size and/or configuration of the power semiconductor device 1 can be reduced.

Next, a couple of manufacturing processes of the power semiconductor device of Embodiment 1 will be described herein.

Firstly, the front and rear wired patterns 16, 18 are formed on the front and rear surfaces of the insulating substrate 10. In forming the rear wired pattern 18, a pair of extruding members 50 is formed adjacent to the thick-layer edge 24, preferably made of material same as material of the rear wired pattern 18.

Then, the semiconductor chips 11, 12 are mounted on the front wired patterns 16 via the second solder layer 14.

The heat radiator (heat sink) 30 is prepared and applied with a solder paste on the principal surface 32. Finally, the insulating substrate 10 is positioned on the solder paste so as to incline relative to the heat sink 30 and then boned thereon by a re-flow step. The extruding member 50 opposing to the heat sink 30 secures the inclined bonding of the insulating substrate 10 relative to the heat sink 30.

Instead of the extruding member 50 extending from the rear wired pattern 18, a pair of bump members of aluminum extending from the heat sink 30 may be formed thereon. Both of the extruding member and the bump members serve a function as spacers between the insulating substrate 10 and the heat sink 30, which secures the inclined bonding of the insulating substrate 10 relative to the heat sink 30.

Alternatively, the inclined bonding can be realized by deliberately pushing the insulating substrate 10 around the wire-bonding area 22 towards the heat sink 30, without forming any spacer members 50. In this case, the forming step of the spacer members can be eliminated.

Further, although two spacer members (the extruding member and the bump members) 50 adjacent to the thick-layer edge 24 are described above, three or more spacer members 50 can be provided adjacent thereto. Also although the space members are provided only adjacent to the thick-layer edge 24 in the above description, another space members 52 may be formed also adjacent to the thin-layer edge 26. In case where another space members 52 are provided, both of the space members 50, 52 have the heights controlled so as to secure the inclined bonding of the insulating substrate 10 relative to the heat sink 30.

As above, the thickness of the solder layer 40 can hardly be controlled to be uniform across the insulating substrate 10. However, it is relatively easy to secure the inclined bonding of the insulating substrate 10 relative to the heat sink 30 so that the solder layer 40 is gradually thinner. Thus, the bonding accuracy required for the present invention is less than that for the prior art. In other words, the spacer members 50 of the present invention has a structure simpler than that of the peripheral trench disclosed in the aforementioned prior art, thus, the power semiconductor device with the improved reliability for the thermal shocks can be produced at a reasonable cost.

According to the present invention, the insulating substrate 10 is deliberately inclined relative to the heat sink 30, the inclined direction is well controlled so that the die-bonding area 20 of the insulating substrate 10 is positioned over the solder layer 40 thicker than that in the wire-bonding area.

Needless to mention, the semiconductor chip adjacent to the thick-layer edge 24 is described as the IGBT 11 generating heat greater than the FWD 12, however, the FWD 12 may be arranged adjacent to the thick-layer edge 24 as well.

Embodiment 2

Figure 5:
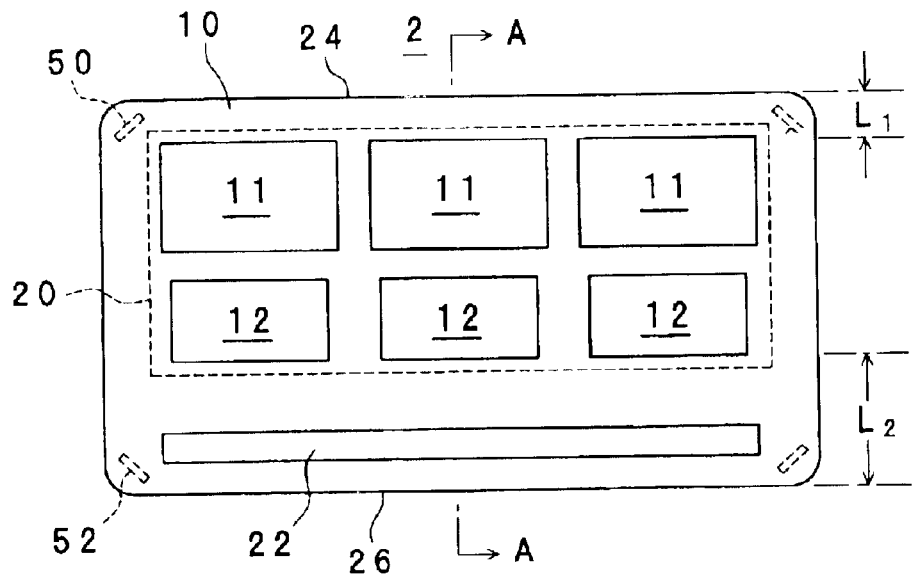
FIG. 5 is a top plan view of the power semiconductor device of Embodiment 2.
Figure 6:
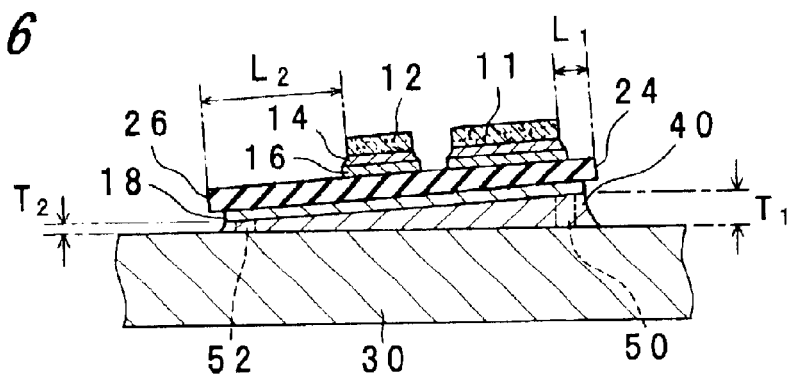
FIG. 6 is a cross sectional view of the power semiconductor device of Embodiment 2 taken along the A—A line of FIG. 5.
Figure 7:
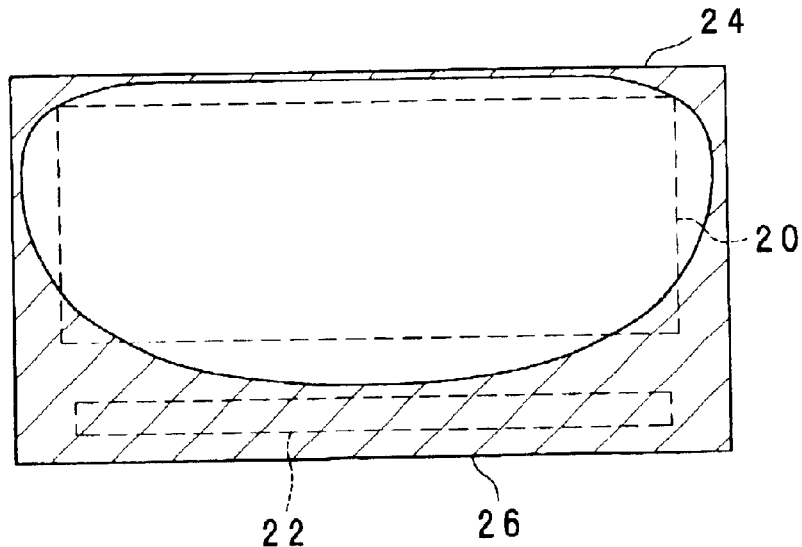
FIG. 7 is a phantom view illustrating the area of the solder cracking extension with the hatching.

Referring to FIGS. 5 to 7, an another power semiconductor device according to Embodiment 2 of the present invention will be described herein. The power semiconductor device 2 of Embodiment 2 has a structure quite similar to that of Embodiment 1 except that it is used for driving three-phase motor and includes the IGBTs 11 and the FWD 12 corresponding to each phase (U-, V- and W-phases). Therefore, the duplicate description for the similar structure of Embodiment 2 will be eliminated.

According to the power semiconductor device 2 of Embodiment 2, the insulating substrate 10 having a substantially rectangular configuration is also inclined in a direction indicated by A—A line (shorter side) relative to a principal surface 32 of the heat sink 30 as shown in FIG. 6. The thick-layer and thin-layer edges 24, 26 are defined by a pair of the opposing longer side surfaces extending substantially in parallel to each other. Thus, the insulating substrate 10 of Embodiment 2 is inclined relative to the principal surface 32 of the heat sink 30 so that the first solder layer 40 is thinner towards a direction from the thick-layer edge 24 to the thin-layer edge 26 ($T_1 > T_2$).

Also, the die-bonding area 20 of the insulating substrate 10 is positioned closer to the thick-layer edge 24 rather than the thin-layer edge 26. Thus, the die-bonding area 20 of the present invention is set such that the first distance ($L_1$) between the thick-layer edge 24 and the IGBT 11 is shorter than the second distance ($L_2$) between the thin-layer edge 26 and the FWD 12 ($L_1 < L_2$).

To this result, the first solder layer 40 beneath the die-bonding area 20 can be thick enough to absorb the stress therein. FIG. 7 illustrates the area of the solder layer 40 with the hatching where the solder cracking extends after the power semiconductor device 1 has been exposed to a predetermined number of thermal shocks. Thus, the extension of the solder cracking from the circumference to the middle portion of the solder layer 40 can be precluded or delayed so that the power semiconductor device having the improved reliability for the thermal shocks can be realized according to the present invention.

Further, since the extension of the solder cracking beneath the die-bonding area 20 can be prevented, the semiconductor chips 11, 12 of Embodiment 2 are arranged much closer to the thick-layer edge of the insulating substrate 10 than those of the conventional power semiconductor device. Thus, the size and/or configuration of the power semiconductor device 1 can be substantially reduced.

Similarly, the spacer members 50 formed adjacent to the thick-layer edge 24 such as extruding members extending from the rear wired pattern 18 and bump members extending from the heat sink 30 may be used for securing the inclined bonding of the insulating substrate 10 relative to the heat sink 30. Alternatively, the inclined bonding can be realized by deliberately pushing the insulating substrate 10 around the wire-bonding area 22 towards the heat sink 30, without forming any spacer members 50.

Embodiment 3

Figure 8:
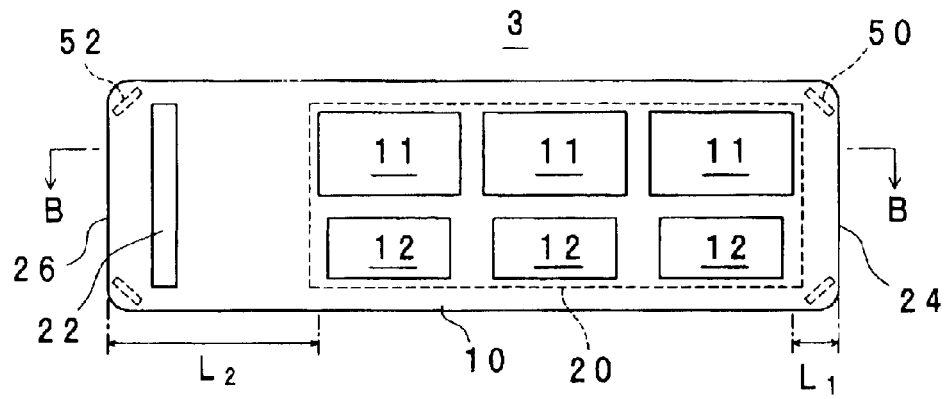
FIG. 8 is a top plan view of a power semiconductor device of Embodiment 3.
Figure 9:
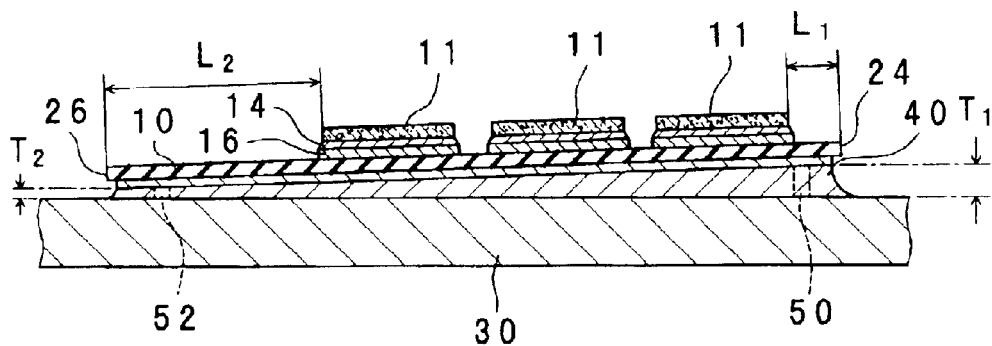
FIG. 9 is a cross sectional view of the power semiconductor device of Embodiment 3 taken along the B—B line of FIG. 8.
Figure 10:
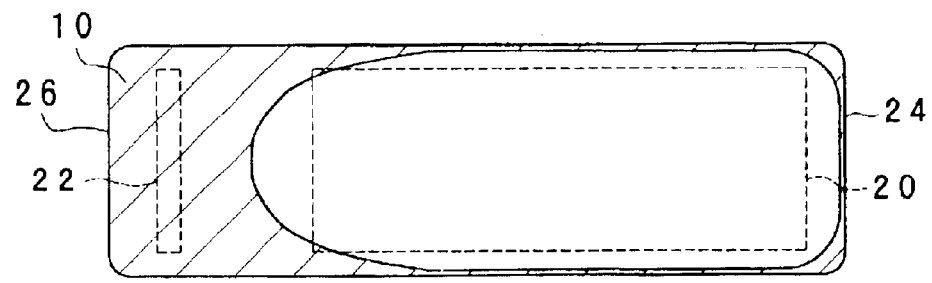
FIG. 10 is a phantom view illustrating the area of the solder cracking extension with the hatching.

Referring to FIGS. 8 to 10, an another power semiconductor device according to Embodiment 3 of the present invention will be described herein. The power semiconductor device 3 of Embodiment 3 has a structure similar to that of Embodiments 1 and 2, therefore, the duplicate description for the similar structure of Embodiments 1, 2 will be eliminated.

According to the power semiconductor device 3 of Embodiment 3, the insulating substrate 10 having a substantially rectangular shape is also inclined in a direction indicated by B—B line (longer side) relative to a principal surface 32 of the heat sink 30 as shown in FIG. 9. The thick-layer and thin-layer edges 24, 26 are defined by a pair of the opposing shorter side surfaces extending substantially in parallel to each other. Thus, the insulating substrate 10 of Embodiment 3 is inclined relative to the principal surface 32 of the heat sink 30 so that the first solder layer 40 is thinner towards a direction from the thick-layer edge 24 to the thin-layer edge 26 ($T_1 > T_2$).

Also, the die-bonding area 20 of the insulating substrate 10 is positioned closer to the thick-layer edge 24 rather than the thin-layer edge 26. Thus, the die-bonding area 20 of the present invention is set so that the first distance ($L_1$) between the thick-layer edge 24 and the IGBT 11 is shorter than the second distance ($L_2$) between the thin-layer edge 26 and the FWD 12 ($L_1 < L_2$).

To this result, the first solder layer 40 beneath the die-bonding area 20 can be thick enough to absorb the stress therein. FIG. 10 illustrates the area of the solder layer 40 with the hatching where the solder cracking extends after the power semiconductor device 1 has been exposed to a predetermined number of thermal shocks. Thus, the extension of the solder cracking from the circumference to the middle portion of the solder layer 40 can be precluded or delayed so that the power semiconductor device having the improved reliability for the thermal shocks can be realized according to the present embodiment.

Further, since the extension of the solder cracking beneath the die-bonding area 20 can be prevented, the semiconductor chips 11, 12 of Embodiment 3 are arranged much closer to the thick-layer edge of the insulating substrate 10 than those of the conventional power semiconductor device. Thus, the size and/or configuration of the power semiconductor device 1 can be substantially reduced.

Similarly, the spacer members 50 formed adjacent to the thick-layer edge 24 such as extruding members extending from the rear wired pattern 18 and bump members extending from the heat sink 30 may be used for securing the inclined bonding of the insulating substrate 10 relative to the heat sink 30. Alternatively, the inclined bonding can be realized by deliberately pushing the insulating substrate 10 around the wire-bonding area 22 towards the heat sink 30, without forming any spacer members 50.

What is claimed is:

1. A power semiconductor device, comprising:
   a heat radiator having a principal surface;
   an insulating substrate bonded on the principal surface of said heat radiator via a first solder layer, said insulating substrate having opposed first and second edges and said first solder layer having a thickness which decreases from a vicinity of the first edge to a vicinity of the second edge; and
   at least one semiconductor chip mounted on said insulating substrate via a second solder layer such that said first edge is located at a first distance from said at least one semiconductor chip said second edge is located at a second distance from said at least one semiconductor chip, and said first distance is less than said second distance.

2. The power semiconductor device according to claim 1, wherein a plurality of semiconductor chips are mounted on said insulating substrate such that the first distance between the first edge and one of said plurality of semiconductor chips that is closest to the first edge is less than the second distance between the second edge and one of said plurality of semiconductor chips that is closest to the second edge.

3. The power semiconductor device according to claim 1, further comprising:
   a spacer provided adjacent the first edge between said heat radiator and said insulating substrate.

4. The power semiconductor device according to claim 3, wherein said spacer is an extruding member extending from said insulating substrate.

5. The power semiconductor device according to claim 3, wherein said spacer is a bump member extending from said heat radiator.

6. The power semiconductor device according to claim 1, further comprising:
   first and second semiconductor chips mounted on said insulating substrate, wherein the first distance between the first edge and said first semiconductor chip is less than the second distance between the second edge and said second semiconductor chip.

7. The power semiconductor device according to claim 6, wherein an amount of heat generated from said first semiconductor chip is greater than an amount of heat generated from said second semiconductor chip.

8. The power semiconductor device according to claim 6, wherein said first and second semiconductor chips include an insulating gate bipolar transistor and a free wheel diode, respectively.

9. The power semiconductor device according to claim 1, wherein said insulating substrate includes a wire-bonding area thereon adjacent the second edge.

10. The power semiconductor device according to claim 1, wherein said insulating substrate includes a pair of opposing side surfaces extending substantially in parallel to each other, the opposing side surfaces defining the first and second edges.

11. The power semiconductor device according to claim 3, further comprises:
    a spacer provided adjacent the second edge between said heat radiator and said insulating substrate.

12. The power semiconductor device according to claim 11, wherein a height of said spacer provided adjacent the second edge is smaller than a height of said spacer provided adjacent the first edge.

* * * * *